United States Patent [19]

Gries

[11] Patent Number: 5,688,629
[45] Date of Patent: Nov. 18, 1997

[54] PROCESS FOR THE PRODUCTION OF LITHOGRAPHIC PRINTING PLATES UTILIZING PEEL DEVELOPMENT

[75] Inventor: Willi-Kurt Gries, Wiesbaden, Germany

[73] Assignee: Agfa-Gevaert AG, Leverkusen, Germany

[21] Appl. No.: 439,125

[22] Filed: May 11, 1995

Related U.S. Application Data

[62] Division of Ser. No. 318,542, Oct. 5, 1994.

[30] Foreign Application Priority Data

Oct. 22, 1993 [DE] Germany ............... 43 36 115.3

[51] Int. Cl.$^6$ ........................................... G03F 7/34
[52] U.S. Cl. ........................ 430/254; 430/253; 430/259
[58] Field of Search ............................ 430/253, 259, 430/254

[56] References Cited

U.S. PATENT DOCUMENTS

| 2,230,981 | 2/1941 | Toland et al. | |
|---|---|---|---|
| 3,055,295 | 9/1962 | Perkins et al. | |
| 3,128,181 | 4/1964 | Doggett . | |
| 3,469,983 | 9/1969 | Diener et al. | |
| 3,733,200 | 5/1973 | Takaishi et al. | |
| 4,175,964 | 11/1979 | Uchida et al. | 430/253 |
| 4,210,081 | 7/1980 | Croker . | |
| 4,895,787 | 1/1990 | Platzer | 430/253 |

FOREIGN PATENT DOCUMENTS

| 0 514 186 | 11/1992 | European Pat. Off. . |
| 0 530 674 | 3/1993 | European Pat. Off. . |
| 1090663 | 11/1967 | United Kingdom . |
| A-1212260 | 11/1970 | United Kingdom . |
| A-1530410 | 11/1978 | United Kingdom . |
| 2 023 861 | 1/1980 | United Kingdom . |
| 93/05446 | 3/1993 | WIPO . |

*Primary Examiner*—Christopher G. Young
*Attorney, Agent, or Firm*—Foley & Lardner

[57] ABSTRACT

A photosensitive material useful for the production of lithographic printing plates, which contains (a) a support suitable for lithographic printing plates, (b) a hydrophilic layer which contains a crosslinkable organic polymer or is a layer formed by crosslinking such a polymer, (c) a photopolymerizable layer and (d) a transparent cover film, the adhesion of the photopolymerizable layer (c) to the hydrophilic layer (b) and/or to the cover film (d) being changed by exposure. The material permits the production of lithographic printing plates having high printing performance without the use of liquid processing agents.

20 Claims, No Drawings

PROCESS FOR THE PRODUCTION OF LITHOGRAPHIC PRINTING PLATES UTILIZING PEEL DEVELOPMENT

This application is a division of application Ser. No. 08/318,542, filed Oct. 5, 1994.

BACKGROUND OF THE INVENTION

1. Field of the Invention

The present invention relates to a photosensitive material which is suitable, for example, for the production of lithographic printing plates and contains (a) a support suitable for lithographic printing plates,
(b) a hydrophilic layer comprising an organic polymer,
(c) a photopolymerizable layer, and (d) a transparent cover film.

The invention further relates to a process for the production of lithographic printing plates in which a material of the above mentioned generic type is exposed imagewise and is developed by mechanically peeling apart the transparent cover film and the support. This process is known as the "peel-apart" technique.

Materials and processes of this type have the substantial advantage that they require, for their processing, no developer solutions which have to be disposed of in an environmentally acceptable manner. During the exposure, the adhesion of the photopolymerizable layer to the layers adjacent to it changes, so that, when the cover film and support are peeled apart, the exposed parts of the layer adhere to one side and the unexposed parts to the other side.

2. Description of Related Art

DE-C 15 72 122 describes a process for the production of images, in which a material comprising a transparent film, a photopolymerizable layer and a second film is exposed imagewise and is developed by peeling apart the film to give a negative image and a positive image.

EP-A 514,186 and U.S. Pat. No. 4,895,787 describe similar photopolymerizable materials which are processed by peel-apart development and are used for the production of color proofing films.

The above publications describe materials in which a colorless or colored photopolymerizable layer is arranged between two films adapted to the particular intended use. Adhesion-promoting, release or color layers may be provided, if required, between the photosensitive layer and film supports or cover films. In each case, the exposure results in a change in the adhesion to the film support or cover film or to the layer in between, as well as a change in the cohesion within the photosensitive layer, so that imagewise separation within the photosensitive layer occurs by utilizing the adhesion and cohesion differences when peeling apart the films. Clean separation of the exposed and unexposed parts of the layer from the less adhesive film is permitted by virtue of the fact that the films have relatively smooth surfaces.

The production of lithographic printing plates by this process is more problematic since the nonimage parts must be detached from the surface of the printing plate support, which is usually a grained and, if required, anodized aluminum sheet. Here, even very small residues of the oleophilic photosensitive layer which remain behind in the rough porous support surface would impair the usefulness, since residue leads to scumming in the nonimage parts. Replacement of the support by a material having a smooth surface is not directly possible since the structured hydrophilic surface of the support is required for conveying water during lithographic printing.

DE-A 27 25 762 describes photosensitive printing plates which are processed by peel-apart development. Between the printing plate support and the photosensitive photopolymerizable layer, the materials have a hydrophilic intermediate layer which comprises, for example, a water-soluble silicate. This permits an improvement in layer separation during development, i.e., good differentiation between oleophilic and hydrophilic parts of the surface of the printing plate. However, the highly hydrophilic character of the intermediate layer makes it susceptible to attack by aqueous solutions, so that, in the course of the printing process, the image elements of the oleophilic image layer may be underwashed and attacked or may even be completely detached from the support. Satisfactory print runs therefore cannot be achieved.

DE-A 29 23 980 describes a similar printing plate which has a photosensitive intermediate layer based on diazo compounds and a photopolymerizable layer thereon. This plate permits better anchoring and resistance of the image parts, but there is once again the danger of incomplete removal of the diazo layer, particularly after relatively long storage of the underexposed printing plates, so that here too the problem of scumming occurs.

EP-A 530,674 describes a similar material which contains, between the printing plate support and the photopolymerizable image layer, an intermediate layer comprising a hydrophilic polymer, for example, polyvinyl alcohol, and a polymerizable compound. During exposure, the polymerizable compound takes part in the polymerization of the photopolymerizable layer and ensures greater adhesion between these layers. Here too, the polymerization in the intermediate layer evidently does not offer sufficient resistance to washout during the printing process, so that satisfactory print runs are not achieved.

WO-A 93/5446 describes a material which is similar to that described above but which contains a hydrophilic photopolymerizable intermediate layer having a relatively high proportion of monomers and of photoinitiator. Again, the intermediate layer is subject to the danger of unintentional partial polymerization when it is handled during processing after imagewise exposure in the daylight. In the absence of special precautions, polymerization and hence the imparting of oleophilic properties to the nonimage parts can readily occur, leading to scumming. This layer is therefore preferably washed out with water or fountain solution prior to printing.

SUMMARY OF THE INVENTION

It is therefore an object of the invention provide a negative- or positive-working photosensitive material useful, for example, for the production of lithographic printing plates, which can be processed without the use of liquid developers to give a lithographic printing plate having high printing performance and little tendency to scumming.

It is also an object of the invention to provide a process for the production of such photosensitive material and processes of producing lithographic printing plates using such a photosensitive material.

In accordance with these and other objects, there has been provided a photosensitive material useful for the production of lithographic printing plates which comprises (a) a support suitable for lithographic printing plates, (b) a hydrophilic layer which comprises a crosslinkable organic polymer or is a layer formed by crosslinking an organic polymer (c) a photopolymerizable layer, and (d) a transparent cover film, wherein the adhesion of the photopolymerizable layer (c) to the hydrophilic layer (b) and/or to the cover film (d) is changed by exposure.

In accordance with these and other objects there also has been provided a process for the production of a lithographic printing plate, comprising exposing a material as described above imagewise through the cover film (d) and developing by peeling off the cover film (d) from the support (a), wherein the polymer of the hydrophilic layer (b) is crosslinked before or after exposure.

Further objects, features and advantages of the present invention will become apparent from the detailed description which follows.

DETAILED DESCRIPTION

In the material according to the invention, the hydrophilic layer (b) contains a crosslinkable organic polymer or is a layer formed by crosslinking such a polymer. Any organic polymer or polymers which are crosslinkable or crosslinked can be used in the hydrophilic layer.

The term "crosslinkable" as used in the present Specification means that the polymer is either self-crosslinkable at elevated temperature or is crosslinkable by heating in the presence of crosslinking agents. Such crosslinking may occur during the normal treatment conditions of the process. This means that the layer (b) must contain a crosslinking agent, if the polymer is not self-crosslinkable.

The crosslinkable hydrophilic polymer used for the production of the hydrophilic layer (b) is usually water-soluble. Suitable polymers are described by C. L. McCormick, J. Bock and D. N. Schulz in *Encyclopedia of Polymer Science and Engineering* 17, 730 (1985) the contents of which are hereby incorporated by reference. The crosslinking of the polymers may be achieved in any desired manner. Depending on the functional groups contained in the polymers, crosslinking may be achieved with these polymers alone, for example, by heating. It is frequently advantageous, however, to use low molecular weight or high molecular weight organic or inorganic crosslinking agents. Furthermore, crosslinking catalysts may be added to accelerate the reaction.

The proportion of the crosslinkable polymer in the layer (b) is generally in the range from 20 to 100, preferably from 50 to 100 and particularly preferred from 70 to 99 per cent by weight.

Examples of suitable water-soluble crosslinkable polymers include nucleotides, polypeptides, polysaccharides, polyacrylamides, polyethylene oxides, polyvinyl alcohols, their copolymers or graft copolymers, and the water-soluble derivatives of such polymers, which derivatives are obtained by polymeranalogous reaction. Ionic polymers, such as polyamines, polyimines, polyvinylpyridines, polyvinylpyrrolidones, poly(meth) acrylic acids, polysulfonic acids and polyphosphonic acids, may also be used. Furthermore, the amphoteric acrylate copolymers described in DE-A 40 23 269 and 40 23 268, the contents of both of which are hereby incorporated by reference may advantageously be used. Preferred polymers are those having vinyl alcohol, vinylpyrrolidone and (meth)acrylic acid units.

Suitable crosslinking agents include any desired and useful to crosslink the polymer. Examples include water-soluble polyfunctional compounds which react, with the polymer generally only at elevated temperature, for example, polyhydric alcohols, such as glycols or oligoglycols, glycerol, trimethylolethane or trimethylolpropane, or pentaerythritol; polyfunctional aldehydes, such as glyoxal or glutaraldehyde; polybasic acids, such as oxalic acid or citric acid; oxo acid derivatives of boron, of aluminum, of silicon, of phosphorus or of chromium; or polyfunctional amines, such as ethylenediamine, oligoethyleneoligoamines or polyethyleneimines.

Suitable crosslinking catalysts include any useful for catalyzing the crosslinking, and, are mainly acids or bases, e.g., p-toluenesulfonic acid, sulfuric acid, sodium hydroxide solution, tertiary amines or quaternary ammonium bases. The catalysts are present in an amount effective to catalyze the crosslinking.

The hydrophilic layer may furthermore contain wetting agents, leveling agents, fillers, dyes and UV absorbers in effective amounts to achieve the intended purpose.

The layer weight of the hydrophilic crosslinked or crosslinkable layer is selected to give the desired results and is generally in the range from 0.001 to 1, preferably between 0.01 and 0.5, and in particular from 0.05 to 0.3, $g/m^2$. The amount of crosslinking agent is chosen to give the desired crosslinking and is generally in the range from 0 to 80, advantageously between 0 and 50, in particular between 1 and 30, % by weight, based on the amount of the crosslinkable polymer.

Many crosslinkable polymers or mixtures thereof with crosslinking agents undergo a crosslinking reaction even under the drying conditions of the process of lithographic printing plate production, i.e., at temperatures in the range of 60°–120° C. and in the course of about 1–10 minutes. Other polymers, for example, poly(meth)acrylic acids, remain essentially uncrosslinked under the drying conditions. They are then crosslinked in the course of a thermal aftertreatment of the printing plate, for example, by baking at about 180°–240° C. in the course of 1 to 25, preferably 5 to 20, minutes, and thus become insoluble.

Crosslinking of the layer (b) is, as a rule, desirable and even necessary in order to achieve a long print run in lithographic printing, i.e., good resistance to fountain solution. The crosslinking may be achieved at any point in the process, and even the initially used polymer may be crosslinked. The solubility of the uncrosslinked hydrophilic layer in water or strongly polar solvents generally presents no problems during subsequent application of the photopolymerizable layer since the latter is applied from organic solvents which do not dissolve the hydrophilic layer. The photopolymerizable layer (c) may be any desired photopolymerizable layer, and generally contains, in a manner known per se, (1) a polymeric binder, (2) a compound capable of free radical polymerization, and (3) a compound or a combination of compounds which is capable of initiating the polymerization of the compound (2) under the action of actinic radiation.

The binder (1) should be compatible with the other components of the photopolymerizable layer (c), i.e., no phase separation is permitted within the layer over the entire temperature range of production and use. Furthermore, depending on the version (positive or negative type), either the unexposed or the exposed parts of the layer should exhibit greater adhesion to the cover film (d) than to the hydrophilic layer (b) on the support (a). Conversely, the exposed and unexposed parts should adhere more strongly to the hydrophilic layer (b) on the support (a) than to the cover film (d). A high affinity to printing ink and chemical and mechanical stability. within the printing process are likewise determined by, inter alia, the binder.

Any polymeric binder meeting the characteristics can be used. Examples of suitable polymers include chlorinated polyolefins, for example, chlorinated polyethylenes and chlorinated polypropylenes; poly(meth) acrylates, polyacrylonitrile, polystyrene, polyvinyl chloride, polyvinylidene chloride, polybutadiene, polyisoprene, polychloroprene, chlorinated natural rubbers, polyvinyl acetates, polyvinyl acetals, polyesters, polyamides and polyurethanes, as well as the copolymers of the monomers on which these polymers are based. Chlorinated natural rubbers, poly(meth) acrylates and their copolymers and polyamides are preferably used. Members of the class of the polyvinyl acetals, in particular the polyvinyl butyrals, are also preferably used. The amount of binder in the photopolymerizable layer may be varied to achieve desired results and generally is between 10 and 90%, preferably between 20 and 70%, based in each case on the weight of the nonvolatile components in the photopolymerizable layer.

The compound (2) capable of free radical polymerization may be any such compound and is usually an ethylenically unsaturated substance or a corresponding mixture of substances in the form of esters or amides of acrylic, methacrylic, fumaric or maleic acid. Members having more than one polymerizable double bond are preferred, for example, the esters of the stated acids with alkanediols, (poly/oligo)ethylene glycols, (poly/oligo)propylene glycols, (poly/oligo)butylene glycols and other bifunctional low molecular weight or high molecular weight organic diols. The esters of polyhydric alcohols, such as glycerol, trimethylolethane and trimethylolpropane and pentaerythritol, isocyanuric acid, its ethoxylated or propoxylated derivatives and dimers or oligomers of these compounds are particularly suitable. As high a degree of esterification as possible is advantageous. Amides, for example, the compounds which are formally formed in the reaction of ethylenediamine or its oligomers with the acids described, may likewise be used. The amount of the monomers may be varied to achieve desired results, and is generally about 5 to 80, preferably about 10 to 60, % by weight of the nonvolatile components.

Depending on the desired sensitization range, various materials are useful as photoinitiators (3). For example, if the photo-sensitive material is to be sensitive to the near UV range (350–420 nm) usually used in offset printing, the photoinitiator systems used differ from those employed when it is intended to carry out exposure in the visible spectral range, for example, using laser radiation. Any desired photoinitiator or combination of photoinitiators which give the desired results may be used.

The photoinitiators to be exposed in the near UV range should absorb light in the range between about 250 and 500 nm with formation of free radicals. Examples include acyloins and their derivatives, such as benzoin, benzoin alkyl ethers, vicinal diketones and their derivatives, e.g., benzil, benzil acetals, such as benzil dimethyl ketal, fluorenones, thioxanthones, polynuclear quinones, acridines and quinoxalines, and trichloro- methyl-s-triazines, 2-halomethyl-4-vinyl-1,3,4-oxadiazole derivatives, halooxazoles substituted by trichloromethyl groups, carbonylmethylene heterocycles containing trihalomethyl groups and acylphosphine oxide compounds.

The photoinitiators can also be used in combination with one another or with coinitiators or activators, for example, with Michler's ketone and its derivatives or 2-alkylanthraquinones.

In the case of the photoinitiators used, in particular for laser irradiation in the visible range, mixtures of metallocenes, photoreducible dyes, photolytically cleavable compounds having trihalomethyl groups and, if necessary, further initiator components and dye components are generally suitable, as described, for example, in EP-A 364 735, the contents of which are hereby incorporated by reference, are useful. The metallocene component comprises variously substituted cyclopentadienyl complexes of titanium or of zirconium. Xanthene, benzoxanthene, benzothioxanthene, thiazine, pyronine, porphyrin or acridine dyes can be used as photoreducible dyes. In the case of the trihalomethyl coinitiators, the known triazine derivatives containing bromine or chlorine as halogen have proven particularly useful. Further initiator components are compounds which increase the sensitivity especially in the near UV range, for example, acridine, phenazine or quinoxaline derivatives, or which increase the sensitivity in the visible range, for example, dibenzylacetones or cumarins.

The amount of photoinitiator or of the initiator combination may be varied to achieve the desired results, and is generally about 0.1 to 15% by weight, preferably about 0.5 to 10% by weight, of the nonvolatile layer components.

The photopolymerizable layer may further contain stabilizers for suppressing thermal polymerization, pigments, dyes, plasticizers or other auxiliaries for improving mechanical or reprographicquality in effective amounts. In principle, it should be ensured that the added substances do not absorb an excessive proportion of the actinic light required for the crosslinking and hence reduce the photosensitivity in practice. Where a thermal aftertreatment step is to be carried out in order to increase the stability of the layer, additional components may be present for the thermal curing thereof.

The layer thickness of the photopolymerizable layer (c), expressed by the layer weight may be varied to achieve desired results and is generally 0.1 to 10, preferably 0.5 to 5.0, g/m$^2$.

Suitable flexible transparent cover films (d) for the material according to the invention include all known in the art and are in particular plastics films which are dimensionally stable on heating to about 60°–130° C. For example, films of cellulose acetate, polystyrene, polyamides, polycarbonates, polyesters and polyimides are suitable for this purpose. The film should preferably have little permeability to atmospheric oxygen. Films of polyesters, polycarbonates, polyimides and similar polymers are therefore preferably used; polyester films are generally preferred. The cover film may have any thickness which gives the desired parameter, and generally is in the range from about 10 to 100, preferably 12 to 50, µm. In order to improve the dimensional stability, the films may be biaxially stretched and, if necessary, heat-set.

In order to improve the adhesion of the photopolymerizable layer (c) to the cover film (d), the surface of the cover film can be subjected to an adhesion-increasing treatment, for example, by corona discharge, by etching with chemicals, such as trichloroacetic acid, and/or by coating with an adhesion-promoting lower layer. Such coatings are generally 0.001 to 0.1 µm thick. They may comprise copolymers of (meth)acrylates, as described, for example, in U.S. Pat. No. 4,098,952 the contents of which are hereby incorporated by reference, and may preferably be crosslinked. Suitable cover films are described in U.S. Pat. No. 5,049, 476, the contents of which are hereby incorporated by reference. The surface of the film also may be subjected to a treatment which prevents blocking, for example, by coating with a suitable lower layer which contains finely divided organic or, in particular, inorganic particles, the size, amount and refractive index of which are such that the transparency of the film is not adversely affected. The surface may be smooth or matte. Useful films are described, for example, in EP-A 130,222, the contents of which are hereby incorporated by reference.

The support (a) may be any desired support that is useful, for example, a support such as those used in the production of lithographic printing plates, and is selected depending on the use of the material. For example, the support may be a metallic sheet usually used as support material for lithographic printing plates and having a hydrophilic surface. A preferred metal is aluminum, which preferably is superficially grained and anodically oxidized. The surface also may have been treated in a known manner with alkali metal silicates, phosphates, hexafluorozirconates, polyvinylphosphonic acid or other conventional pretreatment agents. The thickness of the support may be varied to achieve desired results, and is generally between 0.05 and 1, preferably between 0.1 and 0.5, mm.

The photosensitive material may be prepared in any desired manner. For example, it may be prepared by a procedure in which the components of the hydrophilic layer (b) are dissolved in a suitable solvent, generally water or a mixture of water and water-miscible organic solvents, such as lower alkanols, acetone or the like, and are applied to the surface of the support (a) so that, after drying, the desired layer thickness is obtained. The photopolymerizable layer (c) is then applied to the dried intermediate layer, generally also by coating from a solution. The solvent is chosen so that the hydrophilic intermediate layer (b) is not dissolved. The cover film (d) is then applied to the photopolymerizable layer (c) by lamination. Lamination may be effected at room temperature or at elevated temperature.

The photopolymerizable layer may also be applied to the cover film by coating from a solution, and may be dried there and then applied by lamination to the support (a) coated with the hydrophilic layer (b). This lamination process may also be carried out at a later time after storage of the elements comprising (a)+(b) and (c)+(d). In this case, however, it is expedient to cover the bare side of the photopolymerizable layer (c) with a removable protective film, for example, of polyethylene, which is then peeled off only immediately before the lamination.

The photosensitive material obtained is exposed imagewise in any known manner through the transparent cover film (d). Exposure may be effected by means of a correspondingly controlled radiation source, for example, a laser, or in contact under a transparent original. As a result of the imagewise crosslinking of the photopolymerizable layer, its adhesion to the cover film (d) and/or to the hydrophilic intermediate layer (b) is changed so that, when the cover film is peeled off, either the exposed or the unexposed parts of the photopolymerizable layer are removed with the cover film. A positive image remains on the support (a) in the first case, and a negative one in the second case. The adhesion behavior which gives either a positive or a negative image can be controlled by means known in the art.

Since generally, the adhesion of the photopolymerizable layer to the rough surface of the support (a), which is not leveled by the relatively thin hydrophilic layer (b), is greater than that to the transparent cover film (d), this cover film should as a rule undergo an adhesion-enhancing surface treatment, as described above.

In most cases, the photopolymerization results in an increase in the adhesion of the layer (c) to the rough surface of the support (a), which is covered by the intermediate layer (b). A change in this behavior can be achieved by changing the composition, in particular the type of binder and/or polymerizable compound, of the layer (c); or the composition of the hydrophilic layer (b). In many cases hydrophilic layers whose hydrophilic properties are due to the presence of ON groups are used to change the adhesion at the interfaces of (b) to (c) by exposure so that a negative image is obtained. In other cases in which the layer (b) contains, for example, carboxyl groups or other acid groups, positives are frequently obtained.

In general, the nature of the photopolymerizable layer has a relatively major effect on the copies obtained. Predominantly negative copies are obtained with layers which contain conventional free radical initiators and binders based on (meth)acrylate polymers, whereas, as a rule, positive copies are obtained with layers which contain polyvinyl acetals as binders and initiators which form acids on exposure. Techniques for influencing the adhesion behavior are known and are described, inter alia, in the article "Photosensitive Materials by Peel-off Development" by T. Ikeda, T. Yamaoka and T. Tsunoda in *Graphic Arts Japan*, Vol. 21 (1979–1980), pages 26–31, the contents of which are hereby incorporated by reference.

After development of the image, the image remaining on the support can be thermally postcured or baked in a manner known per se, in order to increase the length of the print run. Particularly in the case of positive printing plates in which the unpolymerized parts of the layer remain behind on the support, it is advisable to cure the screen by heating and/or postexposure.

The material and process according to the invention make it possible to obtain lithographic printing plates by a processing method for which no liquid developers or other processing solutions are required. Compared with known processes of this type, the process according to the invention has the advantage that it gives printing plates which permit a substantially longer print run.

The following examples illustrate preferred embodiments of the invention without limiting the invention. Unless stated otherwise, amounts and percentages are to be understood as weight units. The amounts are generally stated in parts by weight (pbw).

EXAMPLE 1 a) A solution of the composition stated below was applied to a 50 µm thick biaxially stretched and heat-set polyethylene terephthalate film whose surfaces on both sides had been pretreated to improve the adhesion (Melinex® 505):

2.36 pbw of polyethyl methacrylate (Tg 65° C., acid number 8), 0.05 pbw of polymethyl methacrylate (Tg 105° C., acid number<1), 2.15 pbw of trimethylolpropane triacrylate, 0.08 pbw of 2-benzyl-2-dimethylamino-1-(4-morpholinophenyl)-butan-1-one, 0.25 pbw of Renol Blue B2G (C.I. 74 160), 0.09 pbw of 4-diethylamino-4'-methoxydibenzalacetone and 0.03 pbw of 2,6-di-tert-butyl-4-methylphenol in 49.8 pbw of butatone, 2.5 pbw of tetrahydrofuran, 35.6 pbw of propylene glycol monomethyl ether and 7.13 pbw of γ-butyrolactone.

After drying, the layer weight was 1.91 g/m$^2$.

b) A 0.3 mm thick electrolytically grained and anodically oxidized aluminum sheet having an oxide layer weight of 3.6 g/m$^2$ was aftertreated with a 0.1% strength aqueous polyvinylphosphonic acid solution. An aqueous solution of 0.9% of a partly hydrolyzed polyethylene glycol/vinyl acetate graft polymer having an ester number of 150, 0.1% of glyoxal and 0.01% of p-toluenesulfonic acid was applied to this support by spin coating, so that a layer weight of 0.2 g/m² resulted after drying.

c) The photopolymerizable material described under (a) was laminated, under pressure at 90° C., with the support described under (b). The photosensitive printing plate obtained was exposed to a 5 kW metal halide lamp at a distance of 110 cm for 12 seconds in contact under a test original. The polyester film was then peeled off manually, the unexposed parts of the layer being removed cleanly with the film and the exposed parts of the layer remaining behind together with the cured polyvinyl alcohol layer on the aluminum sheet as a negative copy having good resolution. The negative image was postexposed without an original for 100 seconds and, in order to test the resistance to washing out, was treated in an ultrasonic bath with water (1), with 1% strength aqueous polyethylene glycol-(300)-nonyl-phenol ether solution (2) and with 1% strength sodium dodecylbenzenesulfonate solution (3), for 20 minutes in each case. In no case were the image parts attacked or underwashed. In each case, 25,000 to 30,000 prints of constant quality were obtained on a commercial offset printing press in several tests.

Comparative Example 1

As in Example 1, an aluminum sheet was coated with a 1% strength solution of the graft polymer stated in Example 1 in water. After drying, the layer weight was 0.1 g/m². The photopolymerizable material prepared according to Example 1(a) was, as described under 1(c), laminated with the coated aluminum sheet, exposed, and developed by peeling off the polyester film. The printing plate obtained remained stable in water in the ultrasonic treatment but, since the polymer of the hydrophilic layer was not crosslinked, was slightly underwashed in solution (2) and rather more strongly underwashed in solution (3), this being evident from underwashing and delamination of individual image sections. Under the same pressure conditions as in Example 1, only 8,000 to 10,000 prints of constant quality were obtained.

EXAMPLE 2

As described in Example 1, a polyester film was coated with the following solution:

2.910 pbw of polyethyl methacrylate as in Example 1, 0.728 pbw of polyethyl methacrylate (Tg: 63° C.; acid number 0), 0.140 pbw of polymethyl methacrylate as in Example 1, 2.457 pbw of pentaerythrityl tetraacrylate, 0.203 pbw of bis-cyclopentadienyl-bis-[2,6-difluoro-3-(pyrr-1-yl)-phenyl]-titanium, 0.035 pbw of 2,6-di-tert-butyl-4-methylphenol, 0.0175 pbw of Renol Blue B2G, 0.028 pbw of 2-(p-styrylphenyl)-4,6-bis-trichloromethyl-s-triazine and 0.322 pbw of alcohol-soluble Eosin (C.I. 45 386) in 5.12 pbw of butanone, 34.9 pbw of propylene glycol monomethyl ether and 6.98 pbw of γ-butyrolactone The layer weight was 2.14 g/m² after drying. The further processing was carried out as in Example 1, but exposure was effected for 9 seconds using a 500 W incandescent lamp (distance=110 cm). After the polyester film had been peeled off, a negative image remained, which was stable in the ultrasonic bath under the conditions described in Example 1 and, on a commercial offset printing press, gave over 20,000 prints of constant quality.

EXAMPLE 3

As described in Example 1, a polyester film was coated with the following solution:

2.24 pbw of an alkyl methacrylate copolymer 80° C., acid number 5), 17.9 pbw of polyvinyl butyral (80% of vinylbutyral units, 18% of vinyl alcohol units, 2% of vinyl acetate units, Tg 72°–78° C.), 28.0 pbw of pentaerythrityl tetraacrylate, 1.12 pbw of 2-(p-styrylphenyl)-4,6-bis-trichloromethyl-s-triazine, 6.44 pbw of Renol Blue B2G and 0.28 pbw of 2,6-di-tert-butyl-4-methylphenol in 409 pbw of tetrahydrofuran, 279 pbw of propylene glycol monomethyl ether and 55.8 pbw of γ-butyrolactone The layer weight was 2.7 g/m² after drying.

The aluminum sheet described under 1(b) was coated with a solution of 0.5 pbw of trimethylolpropane, 1.98 pbw of polyacrylic acid (MW=5,800, determined by GPC), 0.03 pbw of p-toluenesulfonic acid and 0.1 pbw of nonylphenol polyethylene glycol-(300) ether in 97.4 pbw of water.

After drying, a layer weight of 0.2 g/m² was obtained. The further processing was carried out as in Example 1, but exposure was effected for 14 seconds. Thereafter, the polyester film was peeled off together with the exposed parts of the layer so that a positive copy having good resolution remained behind on the aluminum support. The material exposed under a polyethylene film under reduced pressure without an original for 50 seconds was tested in an ultrasonic bath for resistance to underwashing, as in Example 1. The image sections remained stable in all three solutions and showed no signs of attack.

Comparative Example 2

A printing plate was produced as described in Example 3, but the aluminum sheet serving as a support was coated with a solution of 2 pbw of the polyacrylic acid stated in Example 3 in 98 pbw of a 0.1% strength aqueous solution of nonylphenol polyethylene glycol-(300) ether. The layer weight was 0.2 g/m² after drying. In the resistance test, substantial damage to the image was evident after the treatment with solution 3, since the hydrophilic layer did not contain a crosslinked polymer.

EXAMPLE 4

As described in Example 1, a polyester film was coated with the following solution:

7.00 pbw of an alkyl methacrylate copolymer as in Example 3, 56.0 pbw of polyvinyl butyral as in Example 3, 36.0 pbw of pentaerythrityl tetraacrylate, 54.0 pbw of dipentaerythrityl pentaacrylate, 3.60 pbw of 2-(p-styrylphenyl)-4,6-bis-trichloromethyl-s-triazine, 10.8 pbw of terephthalaldehyde, 6.50 pbw of Renol Blue B2G and 0.90 pbw of 2,6-di-tert-butyl-4-methylphenol in 1001 pbw of tetrahydrofuran, 683 pbw of propylene glycol monomethyl ether and 137 pbw of γ-butyrolactone The layer weight was 2.3 g/m².

The aluminum sheet described in Example 1b was coated with a solution of 24.0 g of a 40% strength aqueous solution of an acrylic resin (Röhm Acrytex W 240) in 576 g of a 0.1 percent strength surfactant solution (disodium salt of decyldisulfodiphenyl ether). The layer weight after drying was 0.2 g/m². The positive printing plate produced analogously to Example 3 was treated with a gumming solution for baking (about 5% strength solution of an anionic surfactant in water) and then baked for 15 minutes at 200° C., with the result that the lower layer and image-bearing layer were crosslinked. The printing plate was completely stable after the ultrasonic treatment described in Example 1 and showed no quality changes at all on a commercial offset printing press even after 60,000 prints.

EXAMPLES 5 to 12

The photopolymerizable solution stated in Example 1 was applied to a film and dried as described there. The layer weight was 2.5 g/m². As in Example 1, an aluminum sheet was coated with a solution of 0.8 pbw of the graft polymer stated there and 0.2 pbw of one of the crosslinking components stated in Table I below, in 99 pbw of water, and was dried for 1 minute at 100° C. The resulting layer weight is likewise shown in Table I.

TABLE I

| Example | Crosslinking Component | Layer Weight (g/m²) |
|---|---|---|
| 5 | H₃BO₃ | 0.10 |
| 6 | AlCl₃·6H₂O | n.d. |
| 7 | H₄SiO₄* | 0.06 |
| 8 | H₃PO₄ | 0.08 |
| 9 | (NH₄)₆Mo₇O₂₄·4H₂O | 0.12 |
| 10 | H₃P(Mo₃O₁₀)·H₂O | 0.10 |
| 11 | Citric acid/p-toluenesulfonic acid** | 0.11 |
| 12 | Polyacrylic acid/p-toluene-sulfonic acid** | 0.08 |

*Prepared in situ by hydrolysis of tetraethyl orthosilicate
**Amount of p-toluenesulfonic acid in each case 0.01 g
n.d. = not determinable Printing plates were produced and processed as described in Example 1. Negative copies of good quality were obtained and were subjected to the resistance test. Table II shows the results. Solutions 1, 2, and 3 are defined in Example 1.

TABLE II

| Example | Solution 1 | Solution 2 | Solution 3 |
|---|---|---|---|
| 5 | ++ | ++ | ++ |
| 6 | ++ | ++ | ++ |
| 7 | ++ | ++ | ++ |
| 8 | + | + | + |
| 9 | + | + | + |
| 10 | + | + | 0 |
| 11 | ++ | ++ | + |
| 12 | ++ | + | + |
| V2 | ++ | -- | -- |

-- = Image sections severely damaged
- = Image Sections substantially damaged
0 = Image sections slightly damaged
+ = Image sections very slightly damaged
++ = Image sections not damaged It is intended that the specification be considered as exemplary only. Other embodiments of the invention will be apparent to those skilled in the art from consideration of the specification and practice of the invention disclosed herein.

What is claimed is:

1. A process for the production of a lithographic printing plate, comprising exposing a material which comprises in the following order:

(a) a support suitable for lithographic printing plates, (b) a hydrophilic layer which comprises a crosslinkable organic polymer or is a layer formed by crosslinking an organic polymer, and which has a layer weight in the range from 0.001 to 1 g/m²

(c) a photopolymerizable layer, and (d) a transparent cover film, wherein the adhesion of the photopolymerizable layer (c) to the hydrophilic layer (b) and/or to the cover film (d) is changed by exposure, imagewise, through the cover film (d), and developing the exposed material by peeling off the cover film (d) from the support (a), wherein the polymer of the hydrophilic layer (b) is crosslinked before or after exposure.

2. A process as claimed in claim 1, wherein the polymer is crosslinked by heating.

3. A process as claimed in claim 1, wherein the polymer is crosslinked after development by heating to a temperature in the range of 180°–240° C.

4. A process as claimed in claim 1, wherein the polymer of layer (b) is crosslinked by heating to a temperature in the range of 60°–120° C. prior to layer (c) being coated on layer (b).

5. A process as claimed in claim 1, wherein the hydrophilic layer (b) comprises a crosslinkable organic polymer which contains hydroxyl, carboxyl, or amino groups as crosslinkable groups.

6. A process as claimed in claim 1, wherein the hydrophilic layer (b) comprises a crosslinkable organic polymer and a crosslinking agent for the crosslinkable organic polymer.

7. A process as claimed in claim 1, wherein the hydrophilic layer (b) comprises a crosslinkable organic polymer and a crosslinking catalyst for the crosslinkable organic polymer.

8. A process as claimed in claim 1, wherein the photopolymerizable layer (c) comprises, (1) a polymeric binder, (2) a compound capable of free radical polymerization, and (3) a compound or a combination of compounds which is capable of initiating the polymerization of the compound (2) under the action of actinic radiation.

9. A process as claimed in claim 1, wherein the photopolymerizable layer (c) has a layer weight in the range from 0.1 to 10 g/m$^2$.

10. A process as claimed in claim 1, wherein the support (a) is a metallic support.

11. A process as claimed in claim 1, wherein the support (a) is a grained and anodized aluminum support.

12. A process as claimed in claim 1, wherein the hydrophilic layer (b) comprises a crosslinked organic polymer.

13. A process as claimed in claim 1, wherein the hydrophilic layer (b) consists essentially of a crosslinkable organic polymer or is a layer formed by crosslinking an organic polymer, and optionally one or more of a crosslinking agent, crosslinking catalyst, wetting agent, leveling agent, filler, dye, or UV-absorber.

14. A process as claimed in claim 1, wherein the hydrophilic layer (b) has a layer weight in the range from 0.01 to 0.5 g/m$^2$.

15. A process as claimed in claim 1, wherein the material is positive-working, whereby the exposed portions of the photopolymerizable layer are removed with the peeled-off cover film.

16. A process as claimed in claim 1, wherein the material is negative-working, whereby the unexposed portions of the photopolymerizable layer are removed with the peeled-off cover film.

17. A process as claimed in claim 1, wherein no liquid developers are used.

18. A process as claimed in claim 1, wherein the image remaining on the support is thermally postcured or baked.

19. A process as claimed in claim 1, wherein the polymer of the hydrophilic layer (b) is crosslinked during or after exposure.

20. A process as claimed in claim 1, wherein the polymer of the hydrophilic layer is water-soluble and during the process is crosslinked rendering it water insoluble.

* * * * *

UNITED STATES PATENT AND TRADEMARK OFFICE
CERTIFICATE OF CORRECTION

PATENT NO. : 5,688,629
DATED : November 18, 1997
INVENTOR(S) : Willi-Kurt GRIES

It is certified that error appears in the above-identified patent and that said Letters Patent is hereby corrected as shown below:

Col. 3, line 49:

delete "polymeranalogous" and insert --polymer-analogous--. Column 8, line 3, delete "ON" and insert --OH--. Column 10, line 11, delete "80°C..acid number 5)" and insert --(Tg 80°C, acid number 5)--. Column 11, line 46, delete "$H_3P(Mo_3O_{10}.H_2O$" and insert --$H_3P(Mo_3O_{10})_4 . H_2O$--. Column 12, line 9, delete "Sections" and insert --sections--.

Signed and Sealed this

Seventh Day of July, 1998

Attest:

BRUCE LEHMAN

*Attesting Officer*   *Commissioner of Patents and Trademarks*